(12) United States Patent
Wei et al.

(10) Patent No.: US 12,009,222 B2
(45) Date of Patent: Jun. 11, 2024

(54) METHOD FOR FORMING SEMICONDUCTOR DEVICE STRUCTURE

(71) Applicant: Taiwan Semiconductor Manufacturing Company, Ltd., Hsinchu (TW)

(72) Inventors: Yu-Chen Wei, New Taipei (TW); Chun-Chieh Chan, Hsinchu (TW); Chun-Jui Chu, Taoyuan (TW); Jen-Chieh Lai, Tainan (TW); Shih-Ho Lin, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 235 days.

(21) Appl. No.: 17/556,032

(22) Filed: Dec. 20, 2021

(65) Prior Publication Data

US 2022/0115243 A1 Apr. 14, 2022

Related U.S. Application Data

(63) Continuation of application No. 16/858,820, filed on Apr. 27, 2020, now Pat. No. 11,239,092, which is a
(Continued)

(51) Int. Cl.
*H01L 21/321* (2006.01)
*H01L 21/02* (2006.01)
(Continued)

(52) U.S. Cl.
CPC .... *H01L 21/3212* (2013.01); *H01L 21/02074* (2013.01); *H01L 21/0228* (2013.01);
(Continued)

(58) Field of Classification Search
None
See application file for complete search history.

(56) References Cited

U.S. PATENT DOCUMENTS 5,494,857 A * 2/1996 Cooperman ...... H01L 21/31055
438/692
5,498,565 A 3/1996 Gocho et al.
(Continued)

FOREIGN PATENT DOCUMENTS

CN 1479351 A 3/2004
CN 1680626 A 10/2005
(Continued)

OTHER PUBLICATIONS

Chinese language office action dated Sep. 5, 2022, issued in application No. TW 107131876.
(Continued)

*Primary Examiner* — Allan W. Olsen
(74) *Attorney, Agent, or Firm* — McClure, Qualey & Rodack, LLP

(57) ABSTRACT

A method for forming a semiconductor device structure is provided. The method includes forming a first layer over a substrate. The method includes forming a stop layer over the first layer. The method includes forming a second layer over the stop layer. The second layer is in direct contact with the stop layer. The method includes partially removing the second layer. The method includes performing an etching process to partially remove the stop layer and an upper portion of the first layer, wherein protrusion structures are formed over a lower portion of the first layer after the etching process, and the protrusion structures include the stop layer and the upper portion of the first layer remaining after the etching process. The method includes removing the protrusion structures.

20 Claims, 14 Drawing Sheets

Related U.S. Application Data continuation of application No. 16/027,869, filed on Jul. 5, 2018, now Pat. No. 10,636,673.

(60) Provisional application No. 62/564,396, filed on Sep. 28, 2017.

(51) Int. Cl.
  *H01L 21/28* (2006.01)
  *H01L 21/302* (2006.01)
  *H01L 21/3213* (2006.01)
  *H01L 21/67* (2006.01)
  *H01L 21/768* (2006.01)

(52) U.S. Cl.
  CPC ............ *H01L 21/28* (2013.01); *H01L 21/302* (2013.01); *H01L 21/32139* (2013.01); *H01L 21/67046* (2013.01); *H01L 21/67051* (2013.01); *H01L 21/76829* (2013.01)

(56) References Cited

U.S. PATENT DOCUMENTS

| | | | |
|---|---|---|---|
| 5,665,202 A | 9/1997 | Subramanian et al. | |
| 5,721,172 A | 2/1998 | Jang et al. | |
| 6,001,730 A | 12/1999 | Farkas et al. | |
| 6,387,190 B1 | 5/2002 | Aoki et al. | |
| 6,431,959 B1 | 8/2002 | Mikhaylich et al. | |
| RE38,363 E | 12/2003 | Gocho et al. | |
| 7,201,784 B2 | 4/2007 | Miller et al. | |
| 7,220,322 B1 | 5/2007 | Sun et al. | |
| 7,323,416 B2 | 1/2008 | Liu et al. | |
| 7,402,258 B2 | 7/2008 | Kiehlbauch et al. | |
| 7,919,446 B1* | 4/2011 | Fresco ................. | C11D 7/3245 510/432 |
| 8,569,148 B2 | 10/2013 | Tizuka et al. | |
| 8,765,653 B2 | 7/2014 | Tamboli et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,773,682 B1 | 9/2017 | Hsu et al. | |
| 10,074,542 B2 | 9/2018 | Kubo et al. | |
| 10,170,343 B1 | 1/2019 | Wei et al. | |
| 10,557,107 B2 | 2/2020 | Sun et al. | |
| 11,081,402 B2 | 8/2021 | Shen et al. | |
| 11,469,145 B2 | 10/2022 | Chang et al. | |
| 2002/0005539 A1 | 1/2002 | Whitman et al. | |
| 2003/0119311 A1 | 6/2003 | Basol et al. | |
| 2004/0077295 A1 | 4/2004 | Hellring et al. | |
| 2004/0152318 A1 | 8/2004 | Fukushima et al. | |
| 2006/0163739 A1 | 7/2006 | Komai et al. | |
| 2007/0187258 A1 | 8/2007 | Du et al. | |
| 2007/0235345 A1 | 10/2007 | Du et al. | |
| 2007/0240734 A1 | 10/2007 | Teng et al. | |
| 2008/0042282 A1 | 2/2008 | Saito et al. | |
| 2008/0076688 A1 | 3/2008 | Barnes et al. | |
| 2008/0119116 A1 | 5/2008 | Wen et al. | |
| 2010/0090314 A1 | 4/2010 | Iizuka et al. | |
| 2012/0070972 A1 | 3/2012 | Chen et al. | |
| 2012/0080402 A1* | 4/2012 | Xu .......................... | B44D 3/18 216/22 |
| 2012/0196443 A1 | 8/2012 | Deng | |
| 2012/0258596 A1 | 10/2012 | Busch et al. | |
| 2012/0322265 A1 | 12/2012 | Hsu et al. | |
| 2016/0190000 A1 | 6/2016 | Uzoh et al. | |
| 2017/0221723 A1 | 8/2017 | Ye et al. | |
| 2018/0286699 A1 | 10/2018 | Lin et al. | |
| 2019/0096693 A1 | 3/2019 | Wei et al. | |
| 2019/0152016 A1 | 5/2019 | Wei et al. | |

FOREIGN PATENT DOCUMENTS

| | | |
|---|---|---|
| CN | 103943491 A | 7/2014 |
| CN | 104347413 A | 2/2015 |
| CN | 105742184 A | 7/2016 |
| CN | 106115612 A | 11/2016 |
| CN | 106571294 A | 4/2017 |
| CN | 106935493 A | 7/2017 |
| TW | 201102425 A | 1/2011 |
| TW | 201542810 A | 11/2015 |

OTHER PUBLICATIONS

Chinese language office action dated Dec. 28, 2022, issued in application No. CN 201811041595.X.

Chinese language office action dated Jun. 21, 2023, issued in application No. CN 201811041595.X.

* cited by examiner

METHOD FOR FORMING SEMICONDUCTOR DEVICE STRUCTURE

PRIORITY CLAIM AND CROSS-REFERENCE

This application is a Continuation of U.S. application Ser. No. 16/858,820, filed on Apr. 27, 2020 (now U.S. Pat. No. 11,239,092, issued on Feb. 1, 2022), which is a Continuation of U.S. application Ser. No. 16/027,869, filed on Jul. 5, 2018 (now U.S. Pat. No. 10,636,673, issued on Apr. 28, 2020), which claims the benefit of U.S. Provisional Application No. 62/564,396, filed on Sep. 28, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component or line that can be created using a fabrication process) has decreased. This scaling-down process generally provides benefits by increasing production efficiency and lowering associated costs.

However, since feature sizes continue to decrease, fabrication processes (e.g. photolithography processes and etching processes) continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1B-1 is a perspective view of a polishing apparatus and the semiconductor device structure of FIG. 1B, in accordance with some embodiments.

FIG. 1E-1 is a perspective view of a polishing apparatus and the semiconductor device structure of FIG. 1E, in accordance with some embodiments.

FIG. 1H-1 is a top view of the semiconductor device structure of FIG. 1H, in accordance with some embodiments.

FIG. 4D-1 is a top view of the semiconductor device structure of FIG. 4D, in accordance with some embodiments.

FIG. 4D-2 is a cross-sectional view illustrating the semiconductor device structure along a sectional line I-I' in FIG. 4D-1, in accordance with some embodiments.

DETAILED DESCRIPTION

Figure 1A:
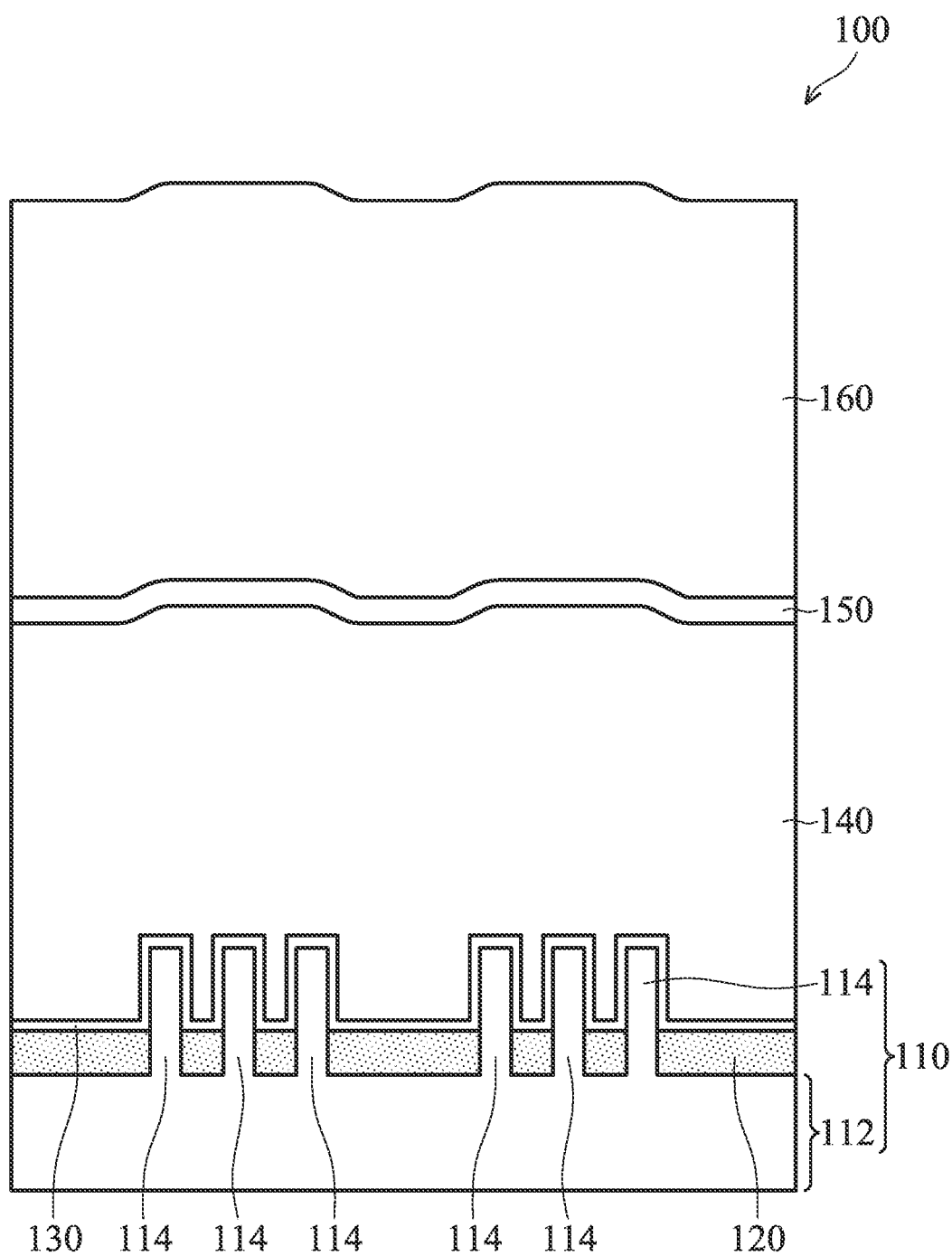
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1H are cross-sectional views of various stages of a process for forming a semiconductor device structure, in accordance with some embodiments. As shown in FIG. 1A, a substrate 110 is provided, in accordance with some embodiments. The substrate 110 has a base portion 112 and fin portions 114, in accordance with some embodiments. The fin portions 114 are over the base portion 112, in accordance with some embodiments. In some embodiments, the substrate 110 is a bulk semiconductor substrate, such as a semiconductor wafer. For example, the substrate 110 is a silicon wafer.

The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes are performed to form the various device elements. The processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an insulating layer 120 is formed over the base portion 112 and surrounds the fin portions 114, in accordance with some embodiments. The insulating layer 120 is made of oxide (such as silicon dioxide), in accordance with some embodiments. The insulating layer 120 is formed by a chemical vapor deposition (CVD) process and an etching back process, in accordance with some embodiments.

As shown in FIG. 1A, a gate dielectric layer 130 is formed over the fin portions 114 and the insulating layer 120, in accordance with some embodiments. The gate dielectric layer 130 conformally covers the fin portions 114 and the insulating layer 120, in accordance with some embodiments. The gate dielectric layer 130 is made of silicon dioxide, silicon nitride, silicon oxynitride, a dielectric material with high dielectric constant (high-K), another suitable insulating material, a combination thereof. The gate dielectric layer 130 is formed using a chemical vapor deposition process (CVD process), in accordance with some embodiments.

As shown in FIG. 1A, a semiconductor layer 140 is formed over the gate dielectric layer 130, in accordance with some embodiments. The semiconductor layer 140 is made of silicon (e.g., polysilicon) or another elementary semiconductor material such as germanium. In some other embodiments, the semiconductor layer 140 is made of a compound semiconductor. The compound semiconductor may include silicon germanium, gallium arsenide, silicon carbide, indium arsenide, indium phosphide, another suitable compound semiconductor, or a combination thereof. The semiconductor layer 140 is formed using a chemical vapor deposition process, in accordance with some embodiments.

As shown in FIG. 1A, a stop layer 150 is deposited over the semiconductor layer 140, in accordance with some embodiments. The stop layer 150 is also referred to as a chemical mechanical polishing (CMP) stop layer or an etching stop layer, in accordance with some embodiments. The stop layer 150 is made of silicon nitride or another suitable material. The stop layer 150 is formed using a chemical vapor deposition process or a physical vapor deposition process, in accordance with some embodiments.

As shown in FIG. 1A, a semiconductor layer 160 is deposited over the stop layer 150, in accordance with some embodiments. The semiconductor layer 160 is made of silicon (e.g., polysilicon) or another elementary semiconductor material such as germanium.

In some other embodiments, the semiconductor layer 160 is made of a compound semiconductor. The compound semiconductor may include silicon germanium, gallium arsenide, silicon carbide, indium arsenide, indium phosphide, another suitable compound semiconductor, or a combination thereof. The semiconductor layer 160 is formed using a chemical vapor deposition process, in accordance with some embodiments. The semiconductor layers 140 and 160 are made of the same material, in accordance with some embodiments. The stop layer 150 and the semiconductor layer 160 are made of different materials, in accordance with some embodiments.

Figure 1B:
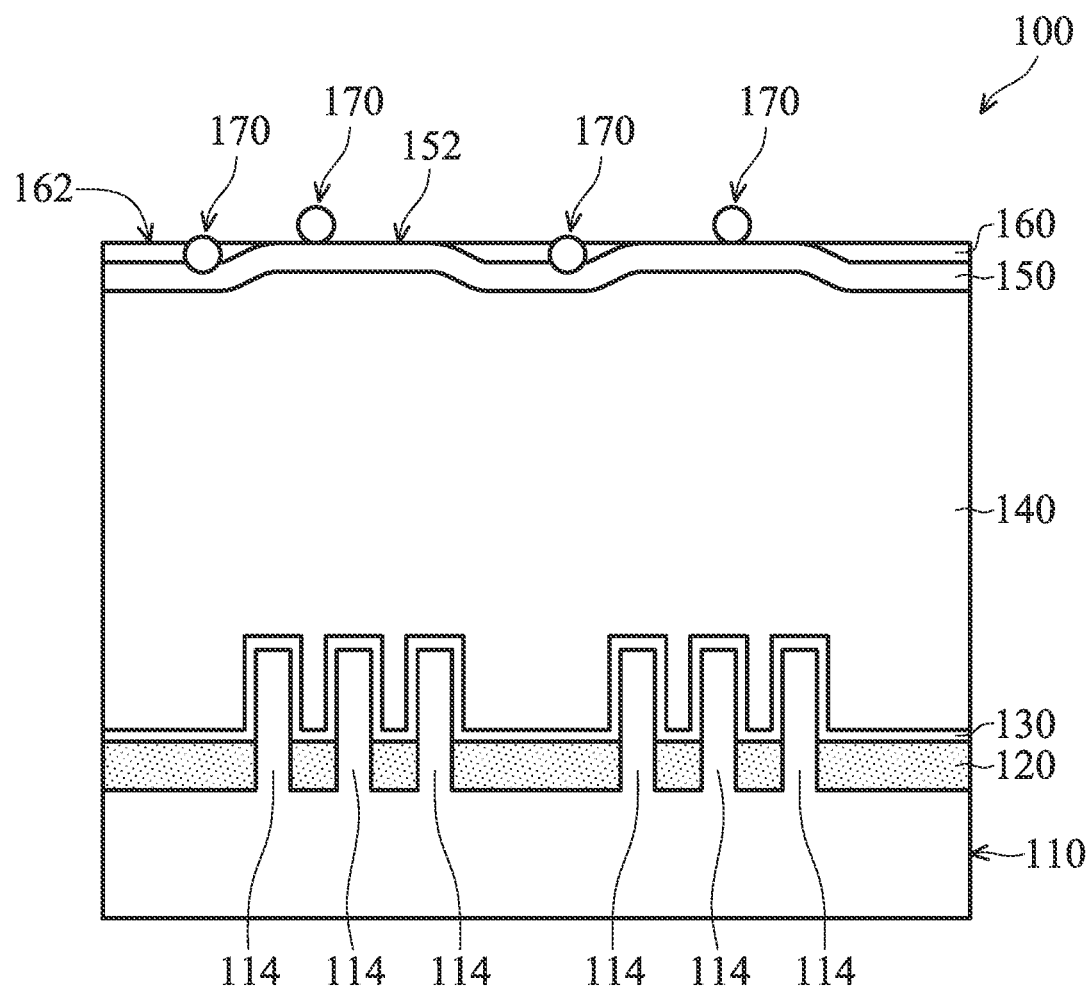

As shown in FIG. 1B, a first planarization process is performed on the semiconductor layer 160 until the stop layer 150 is exposed, in accordance with some embodiments. As shown in FIG. 1B, a flat top surface 162 of the remaining semiconductor layer 160 and a flat top surface 152 of the stop layer 150 are formed after the first planarization process, in accordance with some embodiments.

The flat top surfaces 152 and 162 are substantially coplanar or substantially aligned with each other, in accordance with some embodiments. The term "substantially coplanar" in the application may include small deviations from coplanar geometries. The deviations may be due to manufacturing processes. The first planarization process includes a chemical mechanical polishing process, in accordance with some embodiments.

Figures 1, 1B:
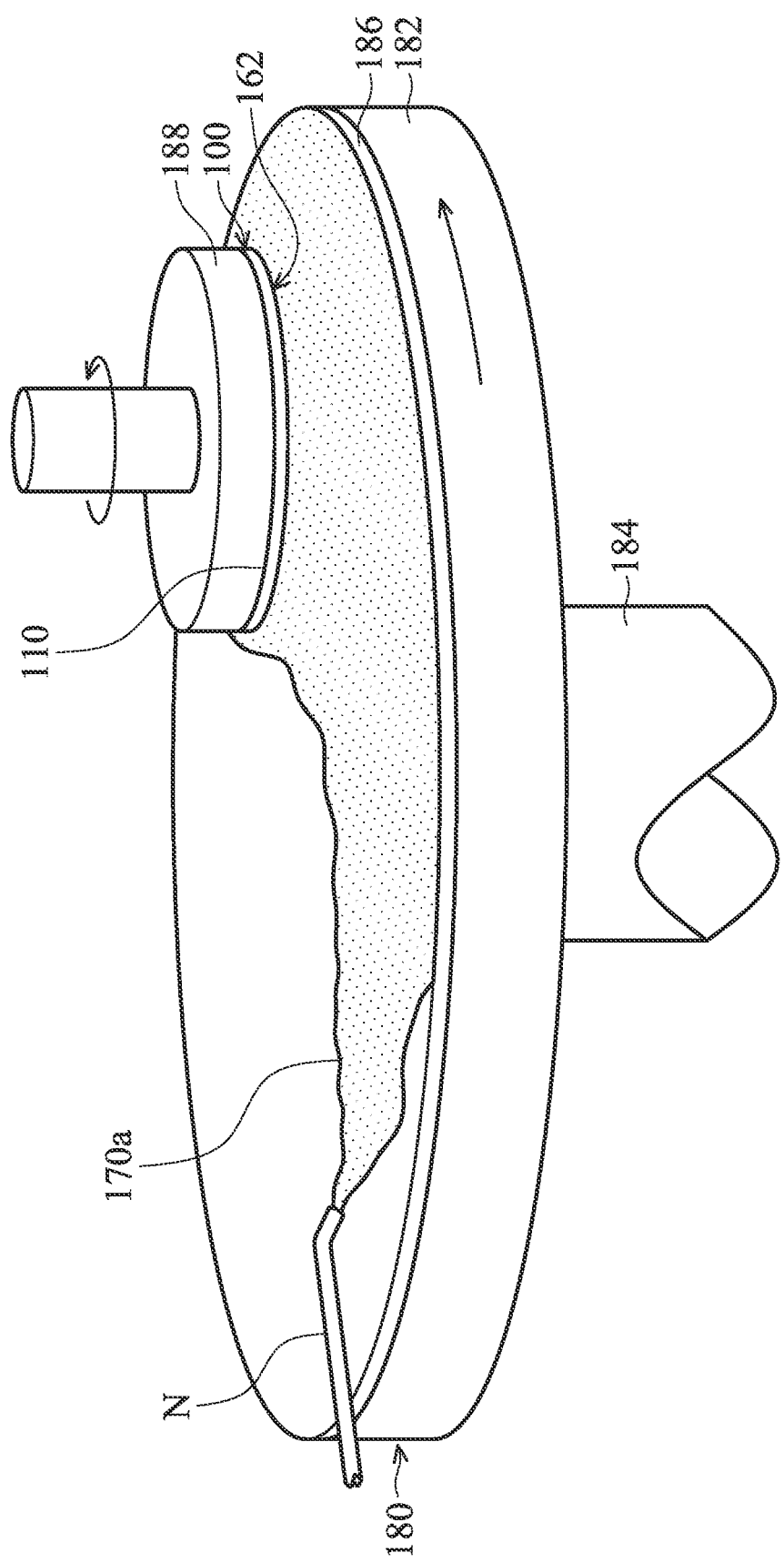

During the first planarization process, the substrate 110 is flipped upside down, as shown in FIG. 1B-1. As shown in FIGS. 1B and 1B-1, the first planarization process uses a polishing apparatus 180 to polish the semiconductor layer 160, in accordance with some embodiments. The polishing apparatus 180 includes a disk-like platen 182, a platen shaft 184, a polishing pad 186, and a polishing head 188, in accordance with some embodiments.

The disk-like platen 182 is rotatable about its central axis, in accordance with some embodiments. The platen shaft 184 is connected to the disk-like platen 182, in accordance with some embodiments. The polishing pad 186 is affixed onto the disk-like platen 182, in accordance with some embodiments. The polishing pad 186 is used to polish the semiconductor layer 160, in accordance with some embodiments.

The polishing head 188 is also referred to as a wafer carrier, in accordance with some embodiments. The polishing head 188 holds the substrate 110, and the flat top surface 162 faces the polishing pad 186, in accordance with some embodiments. The polishing head 188 is rotatable about its central axis, in accordance with some embodiments.

The first planarization process uses a first polishing solution 170a provided by a slurry supply N, in accordance with some embodiments. The first polishing solution 170a is used to mechanically polish the semiconductor layer 160 so as to remove the semiconductor layer 160, in accordance with some embodiments. The first polishing solution 170a is also referred to as a slurry solution, in accordance with some embodiments.

The first polishing solution 170a includes an abrasive material and a polymer material, in accordance with some embodiments. The abrasive material includes metal elements, metal ions, and/or metal oxides, in accordance with some embodiments. The abrasive material includes Al, Ni, Fe, Ti, $Al_2O_3$, NiO, $Fe_2O_3$, $TiO_2$, the like, or a combination thereof, in accordance with some embodiments.

In some embodiments, after the first planarization process, a water cleaning process is performed over the semiconductor device structure 100 to remove the first polishing solution 170a remaining over the semiconductor device structure 100.

As shown in FIG. 1B, after the first planarization process and the water cleaning process, a portion of the first polishing solution 170a remains over or in the stop layer 150 and/or the semiconductor layer 160 and forms residues 170, in accordance with some embodiments. The residues 170 include the polymer material and/or the abrasive material, such as metal elements, metal ions, and/or metal oxides, in accordance with some embodiments.

Figure 1C:
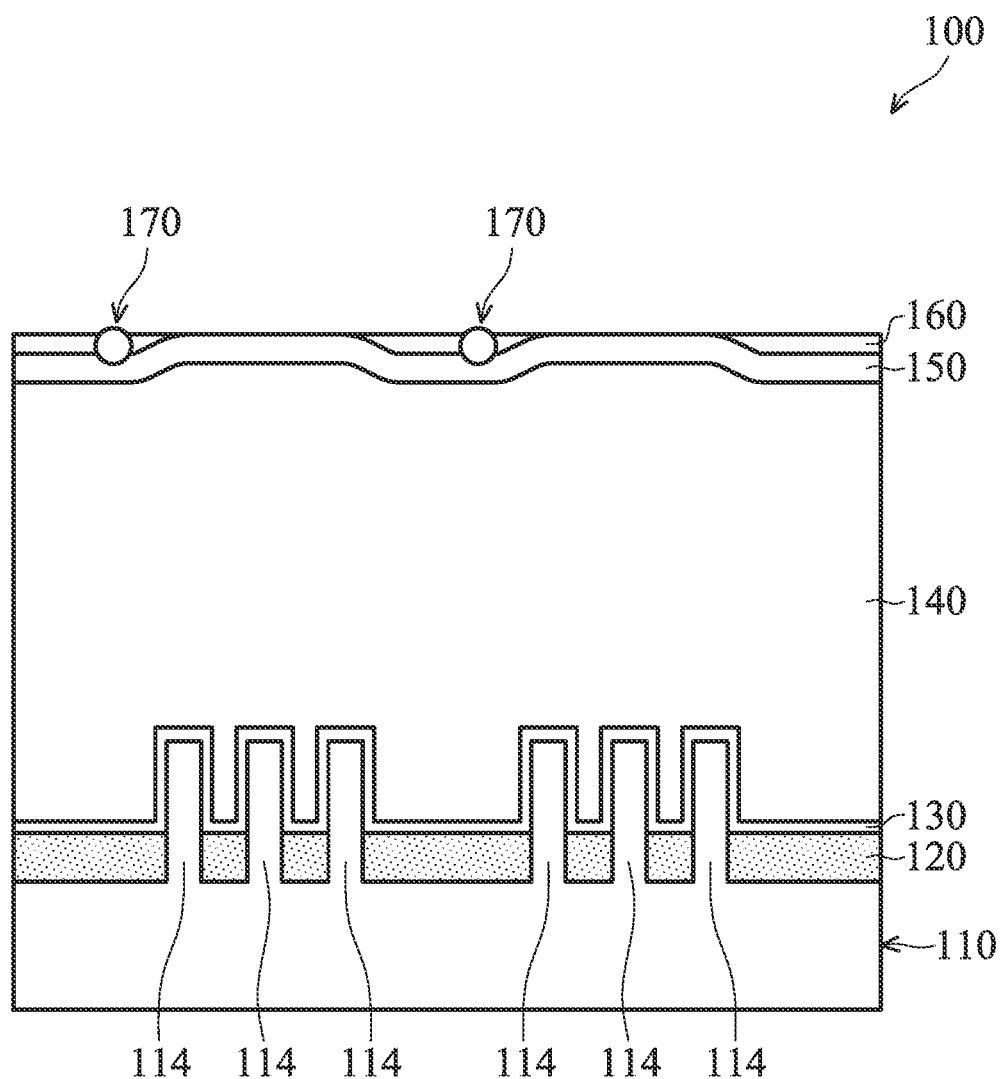
Figure 2A:
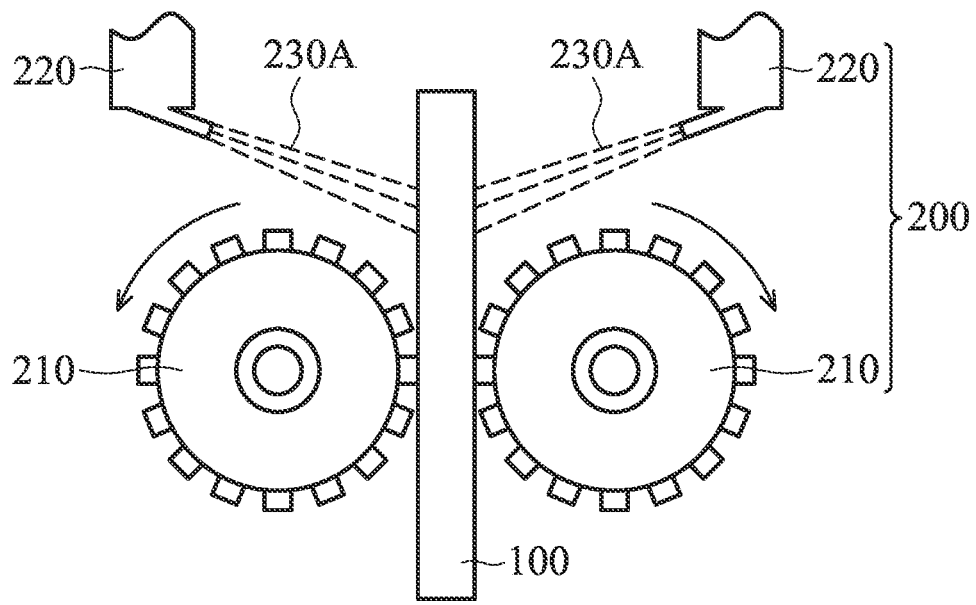
FIGS. 2A-2B are schematic views of various stages of a process for cleaning a semiconductor device structure, in accordance with some embodiments.
Figure 2B:
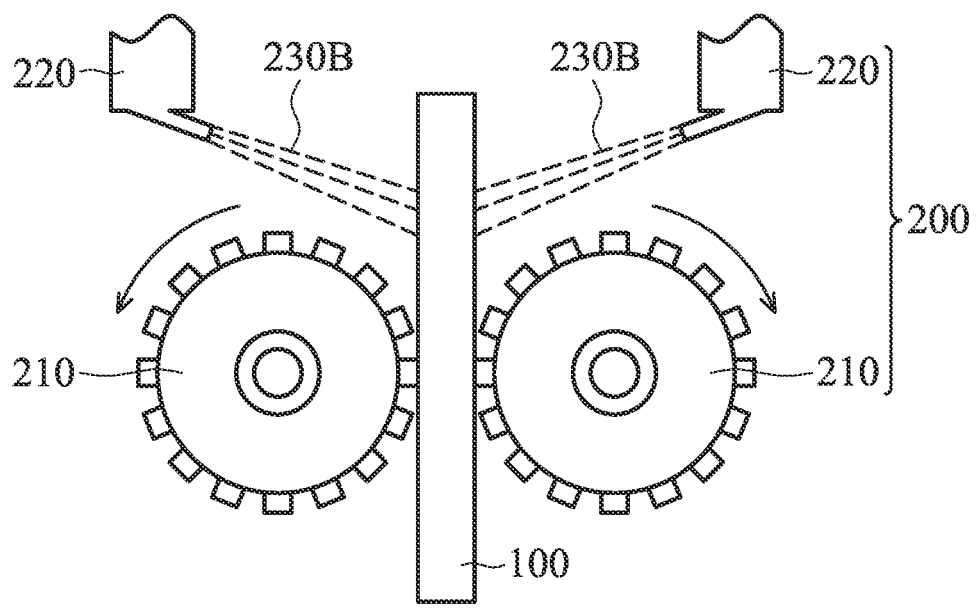

As shown in FIG. 1C, a first cleaning process is performed on the stop layer 150 and the semiconductor layer 160 to remove the residues 170, in accordance with some embodiments. FIGS. 2A-2B are schematic views of various stages of a process for cleaning a semiconductor device structure, in accordance with some embodiments. As shown in FIGS. 1C and 2A, the first cleaning process is performed in a cleaning apparatus 200, in accordance with some embodiments.

The cleaning apparatus 200 includes brushes 210 and nozzles 220, in accordance with some embodiments. The semiconductor device structure 100 of FIG. 1C is positioned between the brushes 210 to be cleaned by the brushes 210, in accordance with some embodiments. Each brush 210 is rotatable about its central axis, in accordance with some embodiments.

In some embodiments, a first cleaning solution 230A is provided on the semiconductor device structure 100 through the nozzles 220 during the first cleaning process. The first cleaning solution 230A includes an alkaline solution, in accordance with some embodiments. The alkaline solution is a weak alkaline solution, for example, of about 0.3 wt % to about 0.5 wt % $NH_4OH$, in accordance with some embodiments. The polymer material and/or metal oxides of the residues 170 may easily dissolve in the alkaline solution.

As shown in FIG. 1C, after the first cleaning process, a second cleaning process is performed on the stop layer 150 and the semiconductor layer 160 to remove the remaining residues 170, in accordance with some embodiments. As shown in FIGS. 1C and 2B, the second cleaning process is performed in the cleaning apparatus 200, in accordance with some embodiments.

In some embodiments, a second cleaning solution 230B is provided on the semiconductor device structure 100 through the nozzles 220 during the second cleaning process. The second cleaning solution 230B includes a chelating agent, in accordance with some embodiments. The chelating agent is able to capture metal of the residues 170, in accordance with some embodiments. Therefore, the second cleaning solution 230B with the chelating agent may effectively remove the remaining residues 170, especially of metal-containing residues.

The chelating agent includes citric acid, oxalic ligand acid, ethylenediamine tetraacetic acid (EDTA), etidronic acid (1-hydroxyethane-1,1-diphosphoric acid), the like, or another suitable chelating agent, in accordance with some embodiments. The second cleaning solution 230B is an acid solution, in accordance with some embodiments. The pH value of the second cleaning solution 230B ranges from about 2 to about 4, in accordance with some embodiments. The pH value of the second cleaning solution 230B is less than the pH value of the first cleaning solution 230A, in accordance with some embodiments.

In some embodiments, after the second cleaning process, a water cleaning process is performed over the semiconductor device structure 100 to remove the second cleaning solution 230B remaining over the semiconductor device structure 100.

Figure 3:
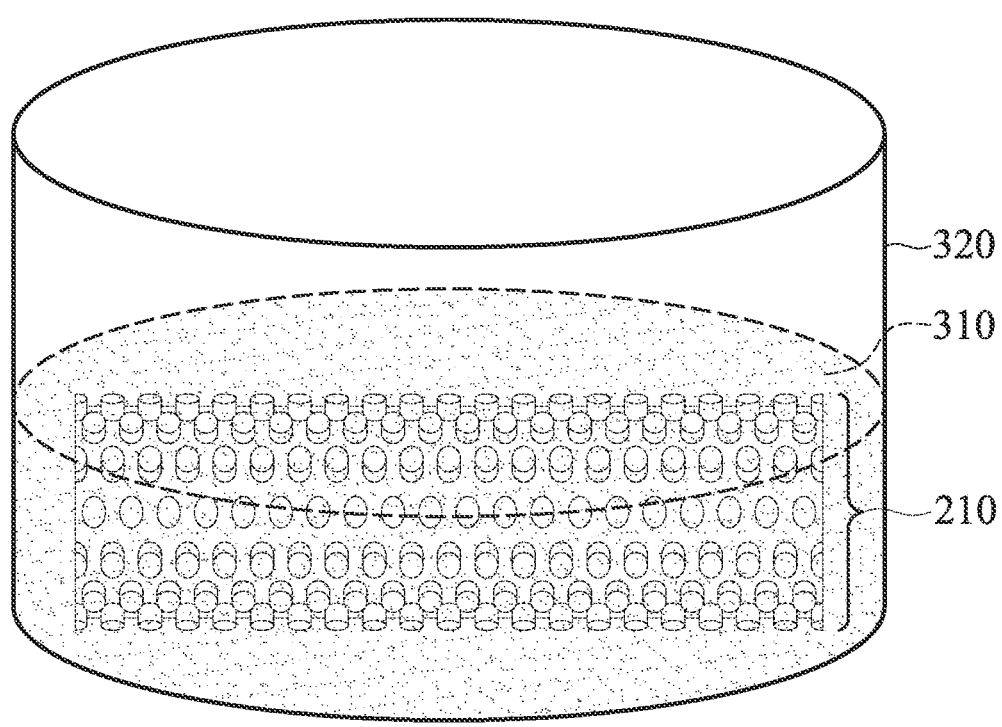
FIG. 3 is a side view of the brushes of FIG. 2 and a tank, in accordance with some embodiments.
Figure 4A:
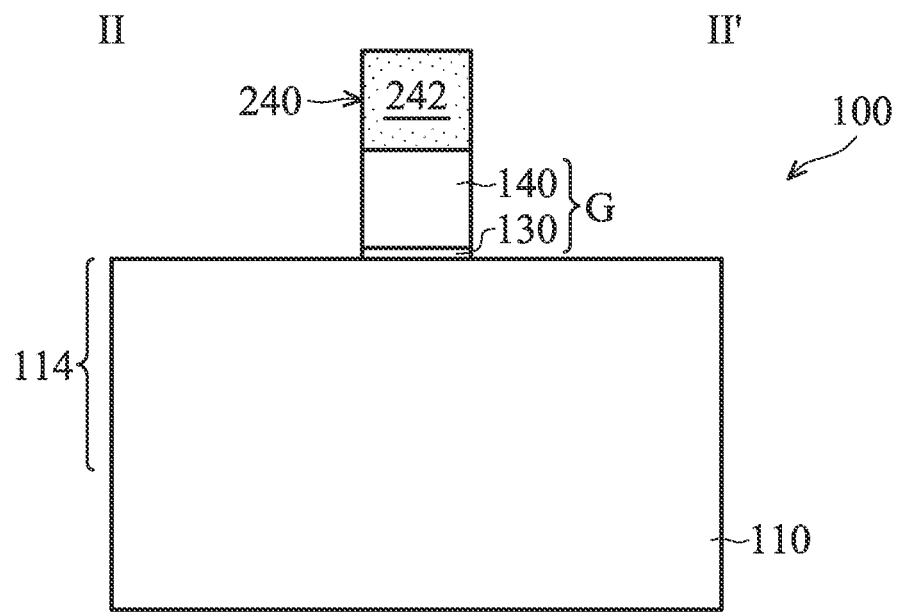
FIGS. 4A-4D are cross-sectional views of various stages of a process for forming a semiconductor device structure, in accordance with some embodiments.
Figure 4B:
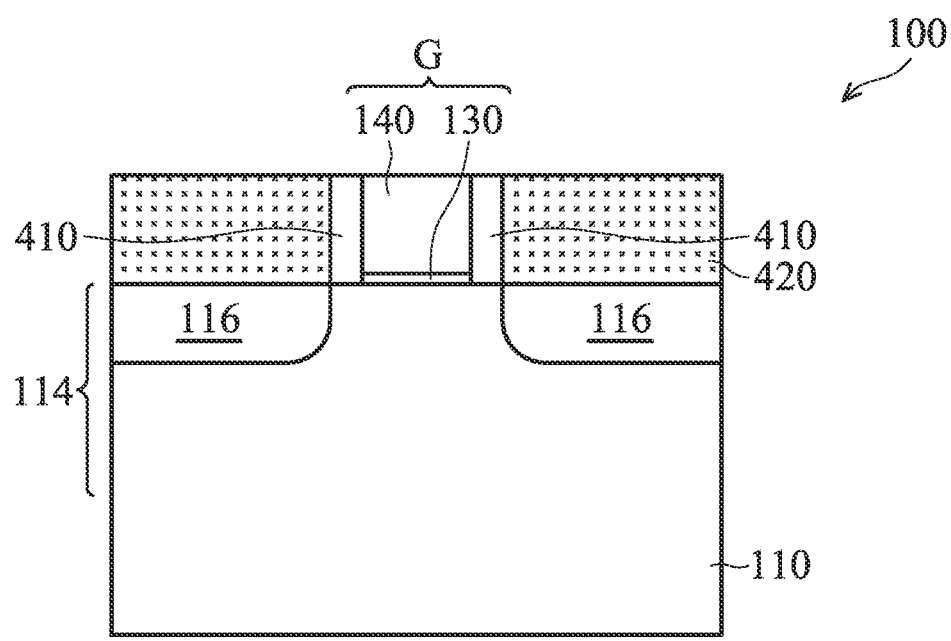
Figure 4C:
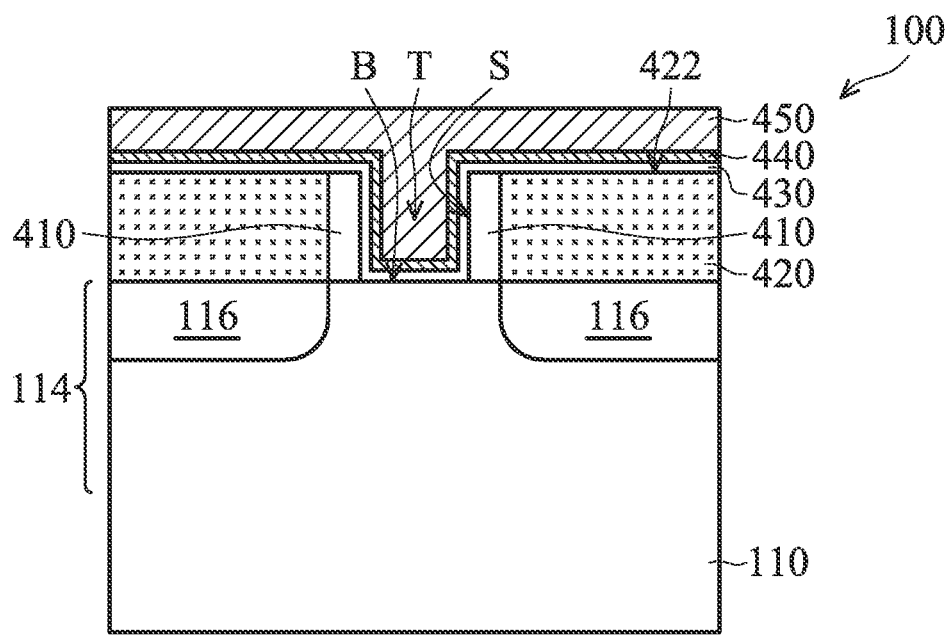
Figure 4D:
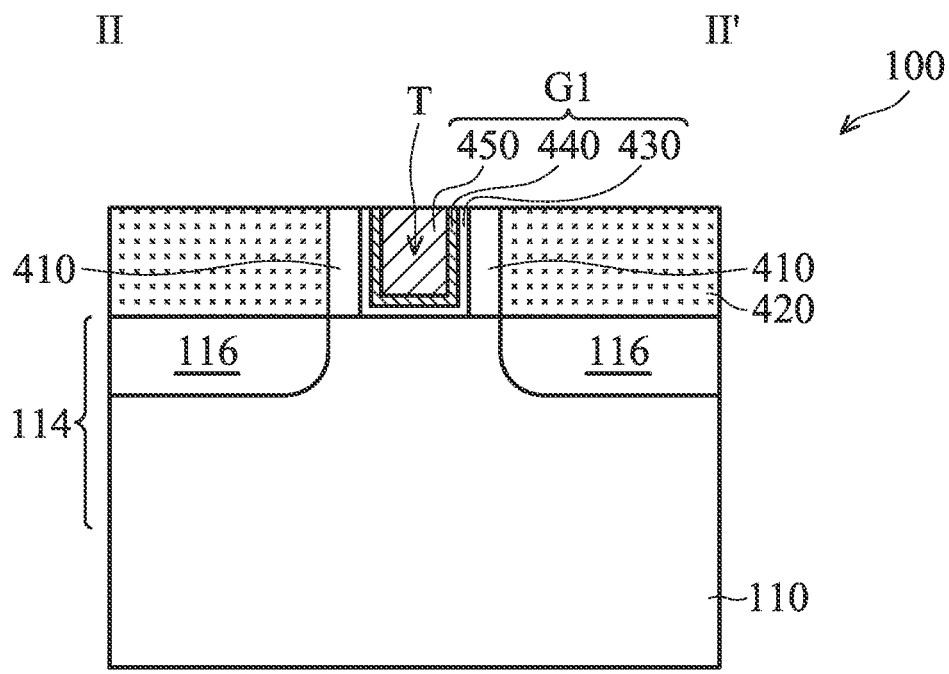
Figures 1, 4D:
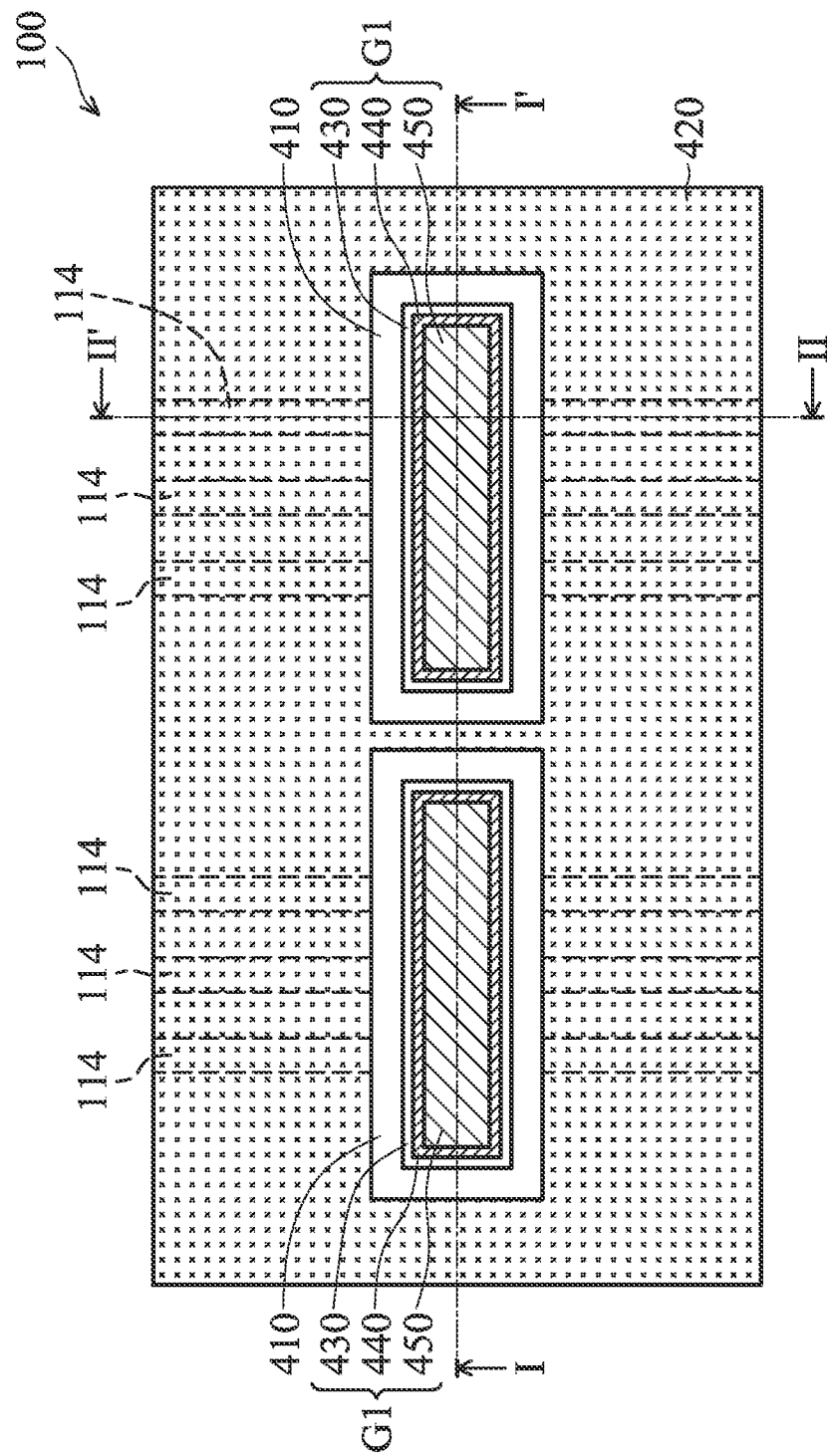
Figures 2, 4D:
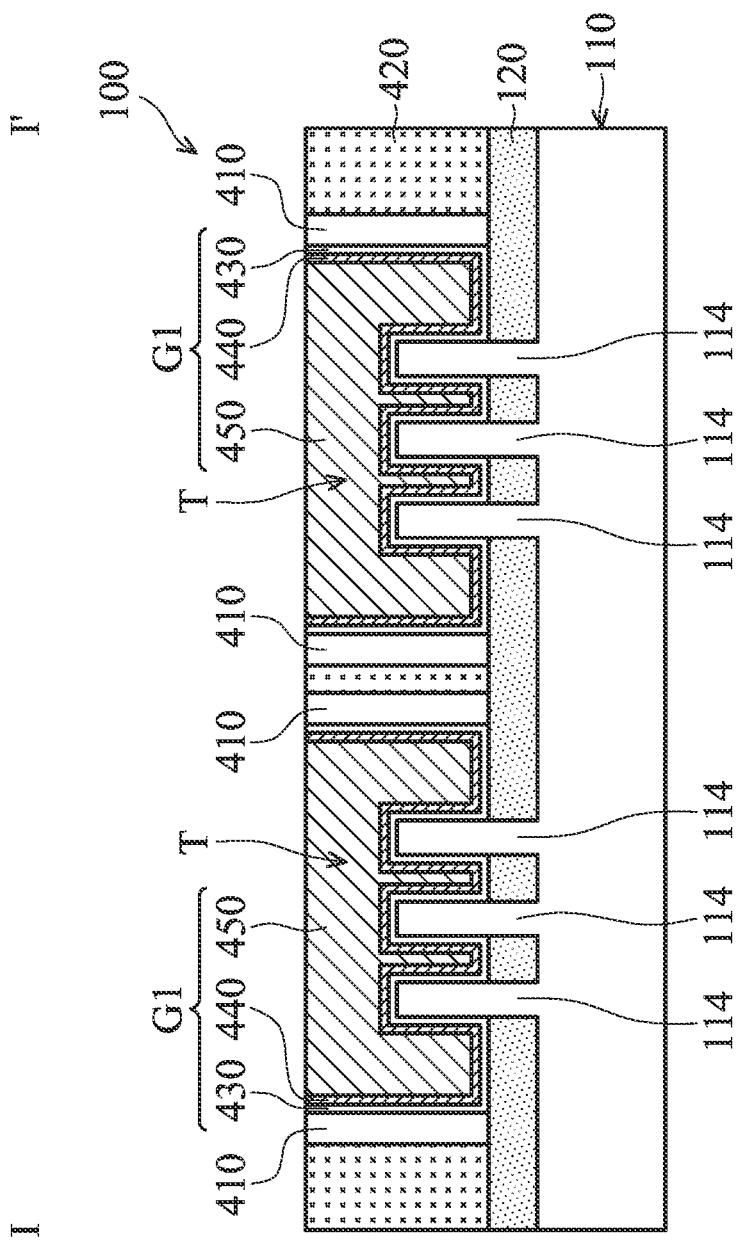

FIG. 3 is a side view of the brushes 210 of FIG. 2 and a tank 320, in accordance with some embodiments. For the sake of simplicity, FIG. 3 only shows one of the brushes 210 of FIG. 2. In some embodiments, metal residues (not shown) coming from other processes remain over the brushes 210. Therefore, as shown in FIG. 3, before the first cleaning process, the brushes 210 are soaked in a cleaning solution 310 in the tank 320 to remove metal residues over the brushes 210. The brushes 210 are in direct contact with the cleaning solution 310, in accordance with some embodiments.

The cleaning solution 310 includes a chelating agent, in accordance with some embodiments. The chelating agent is able to capture metal, in accordance with some embodiments. Therefore, the cleaning solution 310 with the chelating agent may effectively remove metal residues over the brushes 210.

The chelating agent includes citric acid, oxalic ligand acid, ethylenediamine tetraacetic acid (EDTA), etidronic acid (1-hydroxyethane-1,1-diphosphoric acid), the like, or another chelating agent suitable to capture metal, in accordance with some embodiments. In some embodiments, the cleaning solution 310 and the second cleaning solution 230B of FIG. 2B are made of the same material.

Figure 1D:
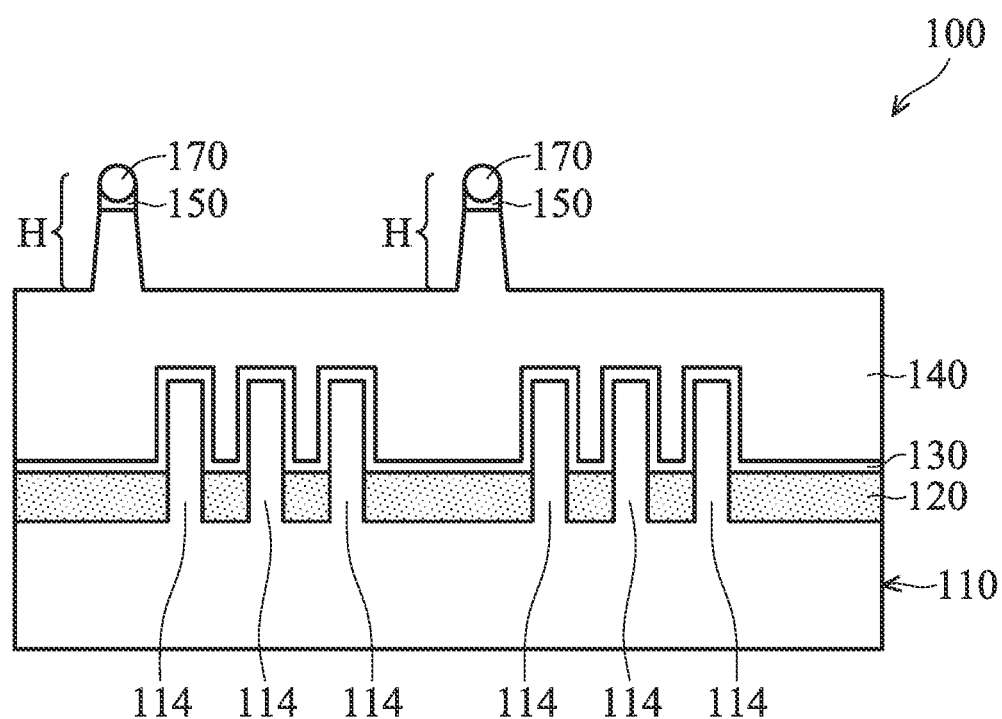

As shown in FIG. 1D, an etching process is performed to remove the semiconductor layer 160, the stop layer 150, and an upper portion of the semiconductor layer 140, in accordance with some embodiments. Since some of the residues 170 may remain after the second cleaning process, the stop layer 150 and the upper portion of the semiconductor layer 140 under the remaining residues 170 may remain after the etching process.

The remaining residues 170, the remaining stop layer 150, and the remaining upper portion of the semiconductor layer 140 together form protrusion structures H, in accordance with some embodiments. The protrusion structures H are also referred to as humps, in accordance with some embodiments.

Figure 1E:
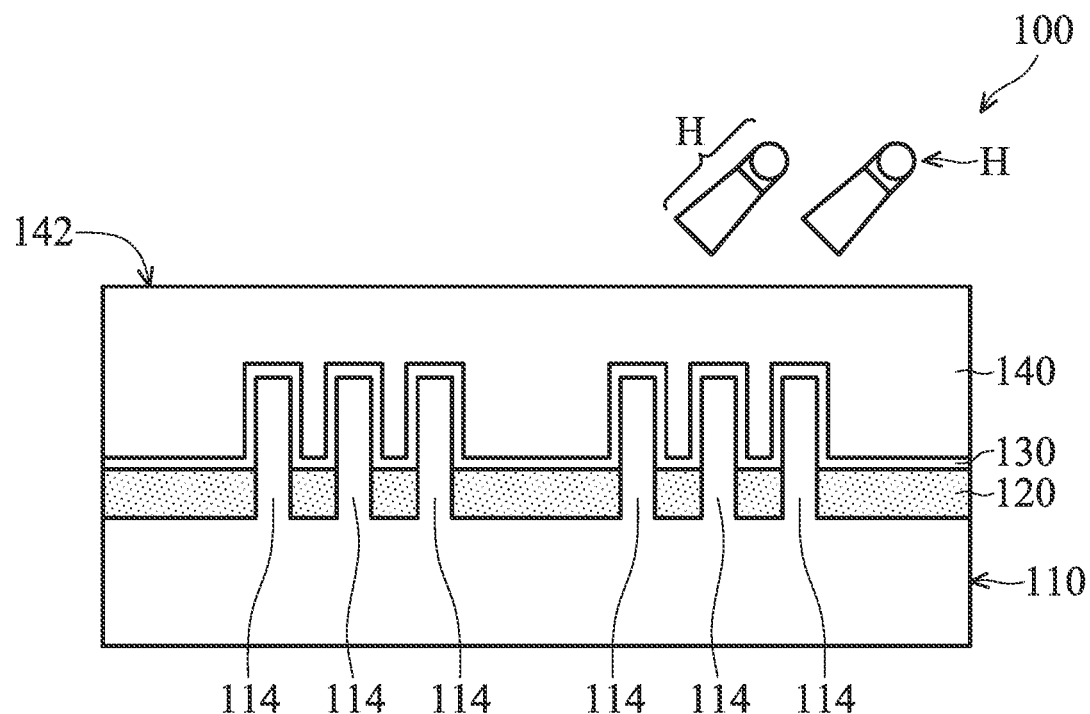
Figures 1, 1E:
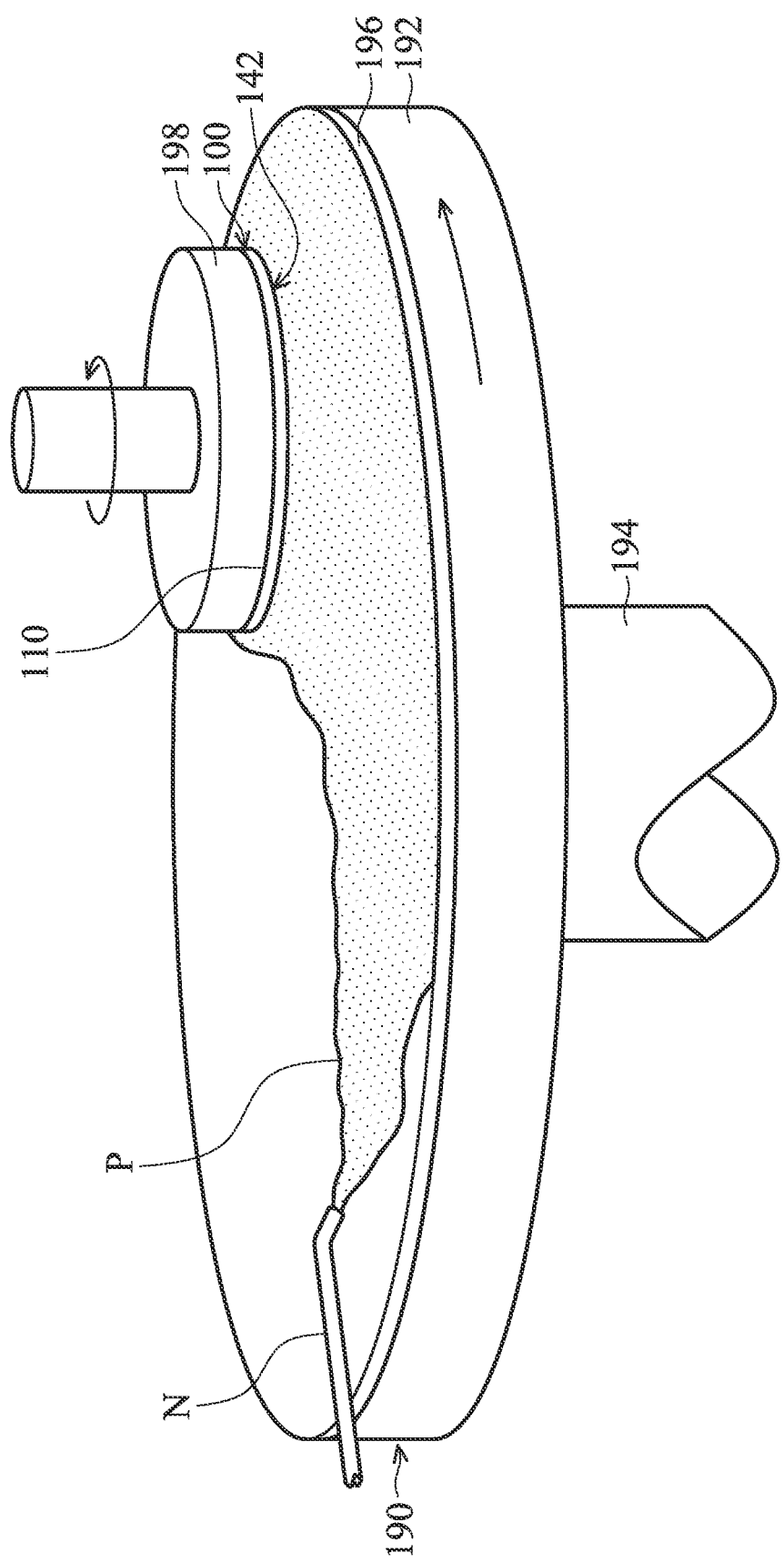

As shown in FIG. 1E, the protrusion structures H are removed by a second planarization process, in accordance with some embodiments. The semiconductor layer 140 is planarized by the second planarization process, in accordance with some embodiments. Therefore, after the second planarization process, a top surface 142 of the semiconductor layer 140 is a substantially flat surface, in accordance with some embodiments. As a result, the second planarization process improves the yield of subsequent processes (e.g. a photolithography process) performed over the top surface 142, in accordance with some embodiments.

The term "substantially flat surface" in the application may include small deviations from flat surface geometries. The deviations may be due to manufacturing processes. The second planarization process includes a chemical mechanical polishing process, in accordance with some embodiments.

During the second planarization process, the substrate 110 is flipped upside down, as shown in FIG. 1E-1. Specifically, the second planarization process is performed in a polishing apparatus 190, in accordance with some embodiments. The polishing apparatus 190 includes a disk-like platen 192, a platen shaft 194, a polishing pad 196, and a polishing head 198, in accordance with some embodiments. The disk-like platen 192 is rotatable about its central axis, in accordance with some embodiments.

The platen shaft 194 is connected to the disk-like platen 192, in accordance with some embodiments. The polishing pad 196 is affixed onto the disk-like platen 192, in accordance with some embodiments. The polishing pad 196 is used to polish the semiconductor layer 140, in accordance with some embodiments. The polishing pad 196 is also referred to as a buffing pad, in accordance with some embodiments. The polishing pad 196 is a porous polishing pad, in accordance with some embodiments. The polishing pad 196 has pores with an average diameter ranging from about 20 μm to about 100 μm, in accordance with some embodiments.

The hardness of the polishing pad 196 is less than the hardness of the polishing pad 186 of FIG. 1B-1, in accordance with some embodiments. Therefore, the second planarization process uses the soft polishing pad 196 to perform a mild polishing process so as to remove the protrusion structures H and to prevent the top surface 142 of the semiconductor layer 140 from being scratched, in accordance with some embodiments.

The polishing head 198 is also referred to as a wafer carrier, in accordance with some embodiments. The polishing head 198 holds the substrate 110, and the top surface 142 faces the polishing pad 196, in accordance with some embodiments. The polishing head 198 is rotatable about its central axis, in accordance with some embodiments.

The second planarization process uses a second polishing solution P provided by the slurry supply N, in accordance with some embodiments. The second polishing solution P is an acid solution or an alkaline solution, in accordance with some embodiments. The pH value of the second polishing solution P ranges from about 1 to about 12.

In some embodiments, the pH value of the second polishing solution P ranges from about 9 to about 13, and metal oxides are dissolved in the second polishing solution P. In some embodiments, the pH value of the second polishing solution P ranges from about 9 to about 10. In some embodiments, the pH value of the second polishing solution P is less than 7, and metal elements are dissolved in the second polishing solution P.

The second polishing solution P includes a polymer surfactant material, in accordance with some embodiments. The polymer surfactant material may improve the hydrophilicity of the semiconductor layer 140. The polymer surfactant material includes an anionic polymer surfactant or a cationic polymer surfactant, in accordance with some embodiments.

The anionic polymer surfactant includes ammonium polyacrylate, organic amine, or the like, in accordance with some embodiments. The cationic polymer surfactant includes tetraalkylammonium compounds, such as hexadecyltrimethylammonium bromide, 1-decyltrimethylammonium chloride, or the like, in accordance with some embodiments. The temperature of the second polishing solution P is controlled to be in a range from about 25° C. to about 40° C. to avoid decreasing the hydrophilicity of the polymer surfactant, in accordance with some embodiments.

The second polishing solution P does not have abrasive materials, in accordance with some embodiments. Therefore, the top surface 142 of the semiconductor layer 140 may be prevented from being scratched by friction with abrasive materials during the second planarization process.

In some embodiments, an abrasive material concentration of the first polishing solution 170a used by the first planarization process in FIG. 1B-1 is greater than an abrasive material concentration of the second polishing solution P used by the second planarization process in FIG. 1E-1.

The abrasive materials include metal elements (e.g., Al, Ni, Fe, or Ti), metal oxides (e.g., $Al_2O_3$, NiO, $Fe_2O_3$, or $TiO_2$), semiconductor oxides (e.g., $SiO_2$), the like, and/or another suitable abrasive material. Therefore, the second polishing solution P does not have metal elements, metal oxides, and/or semiconductor oxides, in accordance with some embodiments. The concentration of metal elements, metal oxides, and/or semiconductor oxides of the second polishing solution P is less than the concentration of metal elements, metal oxides, and/or semiconductor oxides of the first polishing solution 170a.

In some embodiments, after the second planarization process, a water cleaning process is performed over the semiconductor device structure 100 to remove the second polishing solution P remaining over the semiconductor device structure 100. In some other embodiments, the second cleaning process removes most or all of the remaining residues 170, and therefore the second planarization process is not performed.

Figure 1F:
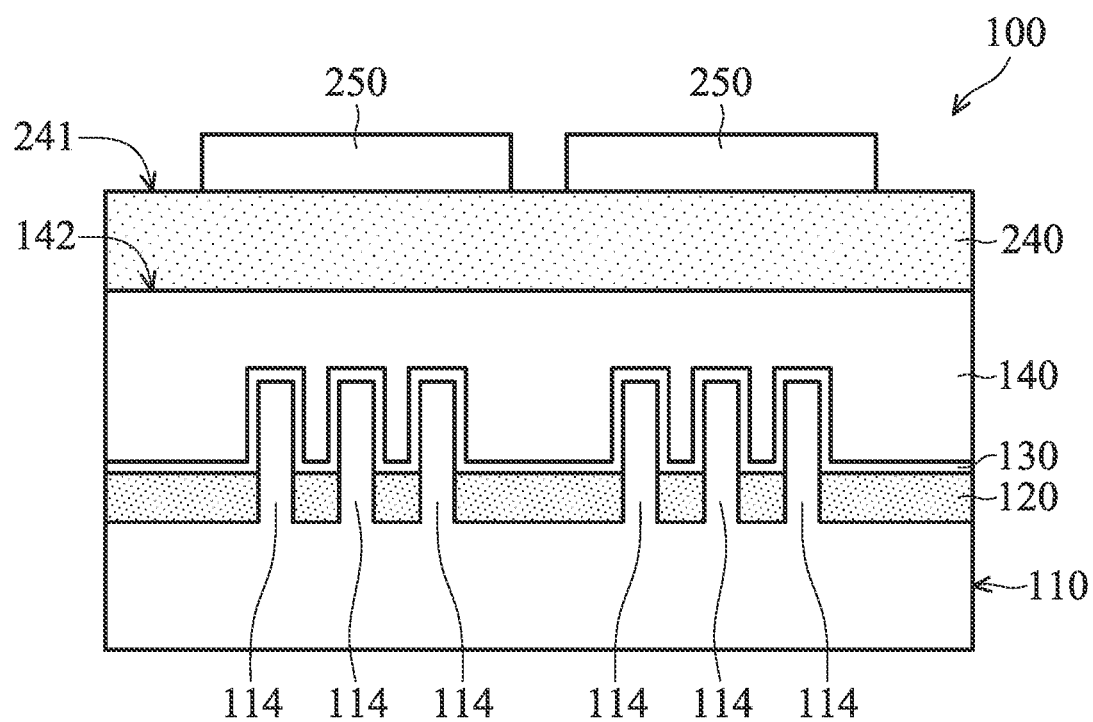

As shown in FIG. 1F, a hard mask layer 240 is formed over the top surface 142 of the semiconductor layer 140, in accordance with some embodiments. Since the top surface 142 is a substantially flat surface, a top surface 241 of the hard mask layer 240 is also a substantially flat surface, in accordance with some embodiments.

The hard mask layer 240 includes nitrides (e.g., silicon nitride), oxides (e.g., silicon dioxide), or another suitable material. The hard mask layer 240 is formed using a deposition process, such as a chemical vapor deposition (CVD) process or a physical vapor deposition (PVD) process, in accordance with some embodiments.

As shown in FIG. 1F, a photoresist layer 250 is formed over the hard mask layer 240, in accordance with some embodiments. The formation of the photoresist layer 250 includes forming a photoresist material layer over the hard mask layer 240, aligning a photomask (not shown) with the hard mask layer 240 (or the semiconductor layer 140), and exposing and developing the photoresist material layer, in accordance with some embodiments.

Since the top surface 241 of the hard mask layer 240 (or the top surface 142 of the semiconductor layer 140) is a substantially flat surface, the yield of the alignment process is improved, in accordance with some embodiments. Therefore, the yield of the exposure process and the development process performed after the alignment process is also improved, in accordance with some embodiments.

As a result, the formation of the flat top surface 241 and/or 142 improves the yield of the formation of the photoresist layer 250, in accordance with some embodiments. The yield of a subsequent etching process using the photoresist layer 250 as an etching mask is improved as well, in accordance with some embodiments. The photoresist layer 250 (or the photoresist material layer) is made of a photoresist material, such as a photosensitive polymer material, in accordance with some embodiments.

Figure 1G:
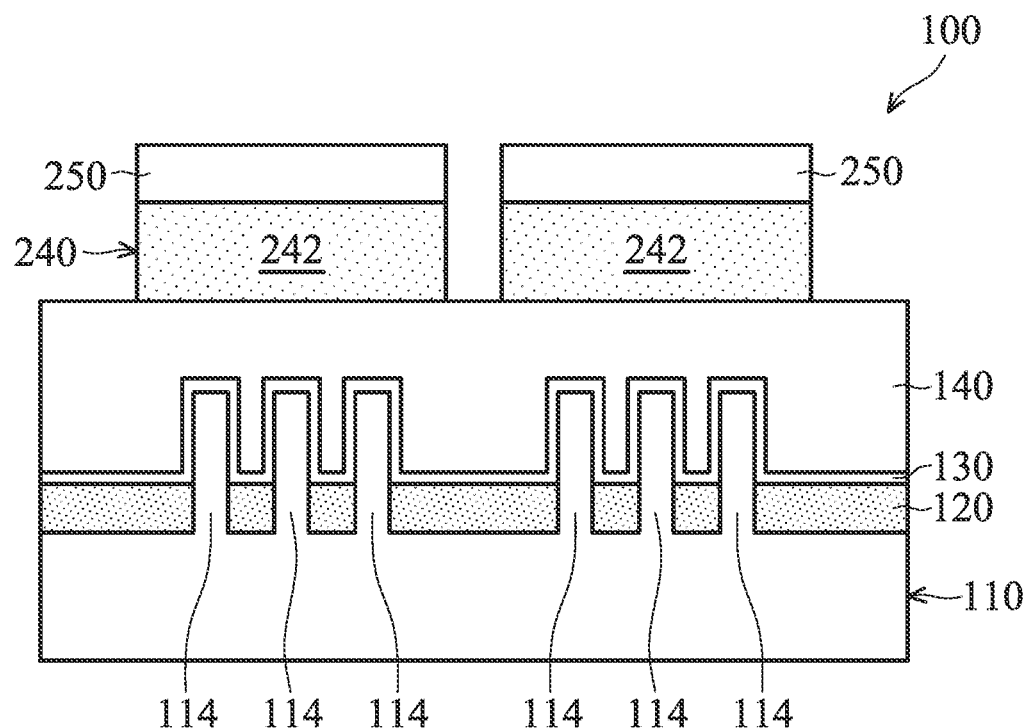

As shown in FIG. 1G, portions of the hard mask layer 240 exposed by the photoresist layer 250 are removed, in accordance with some embodiments. As shown in FIG. 1G, portions 242 of the hard mask layer 240 are remained after the removal process, in accordance with some embodiments. The removal process includes an etching process, such as a dry etching process, in accordance with some embodiments. The etching process uses the photoresist layer 250 as an etching mask, in accordance with some embodiments.

Figure 1H:
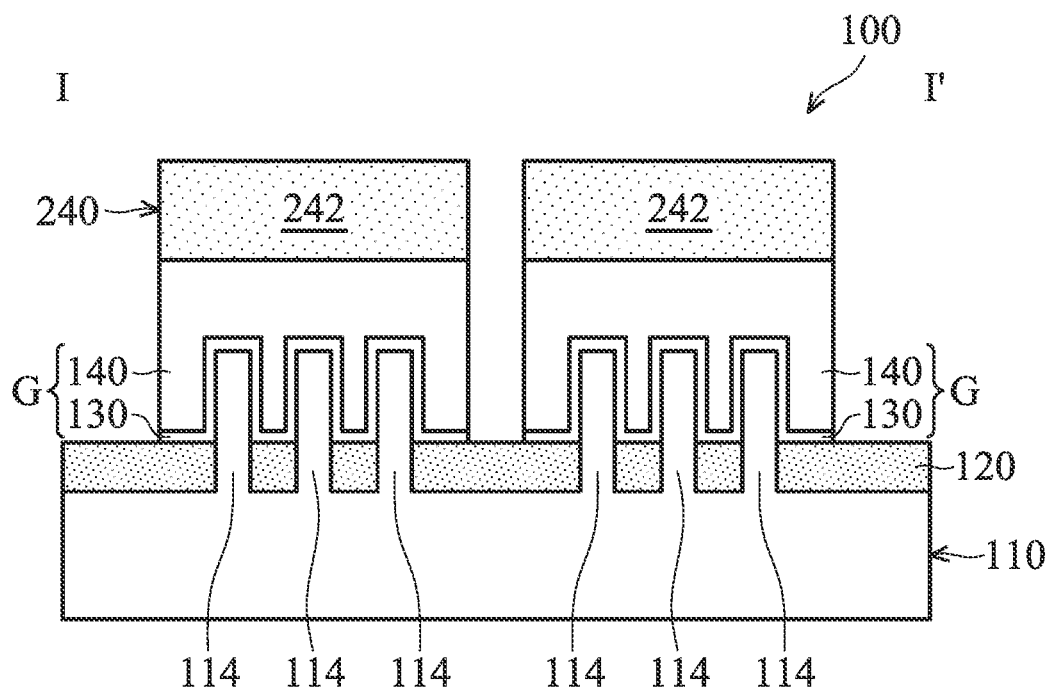
Figures 1, 1H:
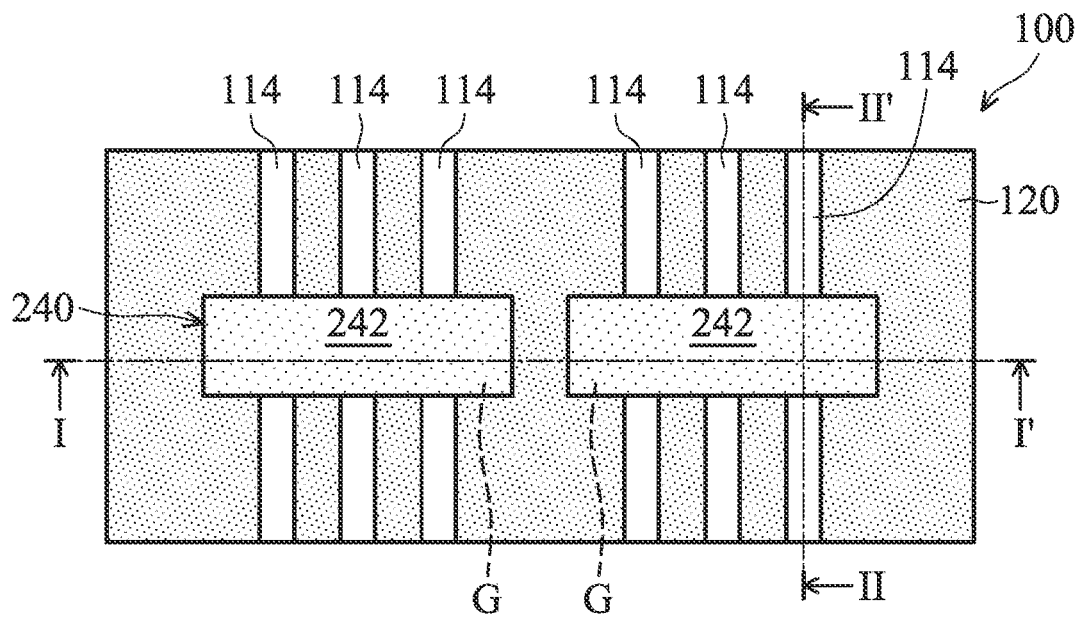

FIG. 1H-1 is a top view of the semiconductor device structure 100 of FIG. 1H, in accordance with some embodiments. FIG. 1H is a cross-sectional view illustrating the semiconductor device structure 100 along a sectional line I-I' in FIG. 1H-1, in accordance with some embodiments. FIG. 4A is a cross-sectional view illustrating the semiconductor device structure 100 along a sectional line II-II' in FIG. 1H-1, in accordance with some embodiments.

As shown in FIGS. 1H, 1H-1, and 4A, the photoresist layer 250 is removed, in accordance with some embodiments. The removal process of the photoresist layer 250 includes an etching process, such as a wet etching process or a dry etching process, in accordance with some embodiments.

As shown in FIGS. 1H, 1H-1, and 4A, portions of the semiconductor layer 140 and the gate dielectric layer 130 under the removed portions of the hard mask layer 240 are removed, in accordance with some embodiments. The removal process of the portions of the semiconductor layer 140 and the gate dielectric layer 130 includes an etching process, such as a dry etching process, in accordance with some embodiments.

As shown in FIGS. 1H, 1H-1, and 4A, the remaining semiconductor layer 140 and the remaining gate dielectric layer 130 under one of the portions 242 of the hard mask layer 240 together form a gate stack G, in accordance with some embodiments. Each of the gate stacks G under the portions 242 is formed across one or more fin portions 114, in accordance with some embodiments.

FIGS. 4A-4D are cross-sectional views of various stages of a process for forming a semiconductor device structure, in accordance with some embodiments. After the step of FIG. 4A, as shown in FIG. 4B, spacers 410 are formed over sidewalls of the gate stacks G, in accordance with some embodiments.

The spacers 410 surround the gate stacks G, in accordance with some embodiments. The spacers 410 include an insulating material, such as silicon dioxide or silicon nitride, in accordance with some embodiments. The spacers 410 are formed using a chemical vapor deposition process and an etching process (e.g., a dry etching process), in accordance with some embodiments.

As shown in FIG. 4B, doped regions 116 are formed in the fin portions 114, in accordance with some embodiments. The doped regions 116 are formed in the fin portions 114 exposed by the gate stacks G and the spacers 410, in accordance with some embodiments. The doped regions 116 are located at two opposite sides of each of the gate stacks G, in accordance with some embodiments. Two adjacent of doped regions 116 are a source region and a drain region, in accordance with some embodiments.

The doped regions 116 are formed using an ion implantation process, in accordance with some embodiments. The ion implantation process uses the gate stacks G and the spacers 410 as an ion implantation mask, in accordance with some embodiments. The ion implantation process is performed to introduce p-type dopants (e.g., boron) or n-type dopants (e.g., phosphorus) into the fin portions 114, in accordance with some embodiments.

Thereafter, in some embodiments (not shown), stressors are formed in the doped regions 116 by using suitable processes, in accordance with some embodiments. The suitable processes include, for example, an etching process for removing a portion of the fin portions 114 and a selective epitaxial growth (SEG) process. Depending on the desired type of the resulting FinFET device, stressors (e.g., SiGe stressors) applying a compressive stress to channel regions under the gate stacks G or stressors (e.g., SiC stressors) applying a tensile stress to channel regions under the gate stacks G are formed.

As shown in FIG. 4B, a dielectric layer 420 is deposited over the insulating layer 120, the fin portions 114, the gate stacks G, the spacers 410, and the hard mask layer 240, in accordance with some embodiments. The dielectric layer 420 includes silicon dioxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The dielectric layer 420 is deposited using a CVD process, a HDPCVD process, a spin-on process, a sputtering process, or a combination thereof, in accordance with some embodiments.

Afterwards, as shown in FIG. 4B, a planarization process is performed on the dielectric layer 420 until top surfaces of the gate stacks G are exposed, in accordance with some embodiments. The planarization process includes a chemical mechanical polishing (CMP) process, in accordance with some embodiments. After the planarization process is performed, the dielectric layer 420 has a substantially planar top surface to facilitate subsequent process steps performed thereover.

As shown in FIG. 4C, the gate stacks G are removed, in accordance with some embodiments. The removal process for removing the gate stacks G includes a wet etching process, a dry etching process, or a combination thereof, in accordance with some embodiments.

As shown in FIG. 4C, after the gate stacks G are removed, trenches T are formed in the spacers 410, in accordance with some embodiments. The trenches T pass through the spacers 410 and the dielectric layer 420, in accordance with some embodiments. The trenches T partially expose the fin portions 114, in accordance with some embodiments.

As shown in FIG. 4C, a gate dielectric layer 430 is formed over bottom surfaces B of the trenches T, in accordance with some embodiments. The gate dielectric layer 430 is further formed over inner walls S of the trenches T, an upper surface 422 of the dielectric layer 420, and the spacers 410, in accordance with some embodiments.

The gate dielectric layer 430 includes a dielectric material, such as a high dielectric constant (high-k) material. The high-k material includes hafnium oxide ($HfO_2$), hafnium silicon dioxide (HfSiO), hafnium silicon oxynitride (HfSiON), hafnium tantalum oxide (HfTaO), hafnium titanium oxide (HMO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 430 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 430 needs to be further annealed.

As shown in FIG. 4C, a work function layer 440 is deposited over the gate dielectric layer 430, in accordance with some embodiments. The work function layer 440 provides a desired work function for transistors to enhance device performance including improved threshold voltage.

In the embodiments of forming an N-type fin field effect transistor (FinFET), the work function layer 440 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a P-type FinFET, the work function layer 440 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or combinations thereof. The work function layer 440 is deposited using a PVD process, CVD process, ALD process, plating process, another suitable method, or combinations thereof, in accordance with some embodiments.

As shown in FIG. 4C, a gate electrode layer 450 (also called a metal gate electrode layer) is deposited over the work function layer 440 to fill the trenches T, in accordance with some embodiments. The gate electrode layer 450 includes a suitable metal material, such as aluminum, tungsten, gold, platinum, cobalt, another suitable metal, an alloy thereof, or combinations thereof, in accordance with some embodiments. In some embodiments, the gate electrode layer 450 is deposited using a PVD process, a plating process, the like, or combinations thereof.

FIG. 4D-1 is a top view of the semiconductor device structure 100 of FIG. 4D, in accordance with some embodiments. FIG. 4D is a cross-sectional view illustrating the semiconductor device structure 100 along a sectional line II-II' in FIG. 4D-1, in accordance with some embodiments. FIG. 4D-2 is a cross-sectional view illustrating the semiconductor device structure 100 along a sectional line I-I' in FIG. 4D-1, in accordance with some embodiments.

As shown in FIGS. 4D, 4D-1, and 4D-2, the gate electrode layer 450, the work function layer 440, and the gate dielectric layer 430 outside of the trenches T are removed, in accordance with some embodiments. The removal process includes a planarization process, in accordance with some embodiments.

The planarization process includes a chemical mechanical polishing (CMP) process, in accordance with some embodiments. The gate electrode layer 450, the work function layer 440, and the gate dielectric layer 430 in the trench T together form a gate stack G1, in accordance with some embodiments.

In accordance with some embodiments, methods for forming semiconductor device structures are provided. The methods (for forming the semiconductor device structures) include performing an etching process to remove an upper portion of a semiconductor layer. After the etching process, residues over the semiconductor layer and the upper portion of the semiconductor layer under the residues remain and together form protrusion structures. The methods include performing a planarization process over the semiconductor layer to remove the protrusion structures so as to planarize a top surface of the semiconductor layer. Since the planarization process improves the flatness of the top surface of the semiconductor layer, the yield of subsequent processes performed over the top surface is improved. The methods include performing a cleaning process to remove the residues before the etching process so as to prevent or reduce the formation of the protrusion structures.

In accordance with some embodiments, a method for forming a semiconductor device structure is provided. The method includes forming a first layer over a substrate. The method includes forming a stop layer over the first layer. The method includes forming a second layer over the stop layer. The second layer is in direct contact with the stop layer. The method includes partially removing the second layer. The method includes performing an etching process to partially remove the stop layer and an upper portion of the first layer, wherein protrusion structures are formed over a lower portion of the first layer after the etching process, and the protrusion structures comprise the stop layer and the upper portion of the first layer remaining after the etching process. The method includes removing the protrusion structures.

In accordance with some embodiments, a method for forming a semiconductor device structure is provided. The method includes providing a first layer. The method includes forming a second layer over the first layer. The second layer is made of a semiconductor material. The method includes performing a first planarization process to remove an upper portion of the second layer. The first planarization process uses an abrasive material, and a portion of the abrasive material remains on the first layer and forms residues after the first planarization process. The method includes removing the residues. The method includes performing an etching process to partially remove an upper portion of the first layer. The method includes performing a second planarization process of the first layer.

In accordance with some embodiments, a method for forming a semiconductor device structure is provided. The method includes forming a first layer over a substrate. The substrate comprises a base portion and a fin portion over the base portion, and the first layer covers the fin portion and the base portion. The method includes forming a second layer over the first layer. The method includes performing a first planarization process to remove a portion of the second layer. The method includes performing an etching process to partially remove an upper portion of the first layer. The method includes performing a second planarization process of the first layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a first layer over a substrate;

forming a stop layer over the first layer;
forming a second layer over the stop layer, wherein the second layer is in direct contact with the stop layer;
partially removing the second layer;
performing an etching process to partially remove the stop layer and an upper portion of the first layer, wherein protrusion structures are formed over a lower portion of the first layer after the etching process, and the protrusion structures comprise the stop layer and the upper portion of the first layer remaining after the etching process; and
removing the protrusion structures.

2. The method for forming the semiconductor device structure as claimed in claim 1, wherein the removing of the protrusion structures comprises:
performing a first planarization process of the first layer.

3. The method for forming the semiconductor device structure as claimed in claim 2, wherein the partially removing of the second layer comprises:
performing a second planarization process until the stop layer is exposed.

4. The method for forming the semiconductor device structure as claimed in claim 3, wherein the first planarization process uses a first polishing solution, the second planarization process uses a second polishing solution, and a first abrasive material concentration of the first polishing solution is different from a second abrasive material concentration of the second polishing solution.

5. The method for forming the semiconductor device structure as claimed in claim 4, wherein the first abrasive material concentration of the first polishing solution is less than the second abrasive material concentration of the second polishing solution.

6. The method for forming the semiconductor device structure as claimed in claim 3, wherein the second planarization process uses a polishing solution, and a portion of the polishing solution remains on or in the stop layer and forms residues after the second planarization process.

7. The method for forming the semiconductor device structure as claimed in claim 6, whereby the residues, the stop layer under the residues, and the upper portion of the first layer under the residues together form the protrusion structures.

8. The method for forming the semiconductor device structure as claimed in claim 3, wherein the first planarization process comprises a first chemical mechanical polishing process, and the second planarization process comprises a second chemical mechanical polishing process, the first planarization process uses a first polishing pad to polish the first layer, the second planarization process uses a second polishing pad to polish the second layer, and the first polishing pad is softer than the second polishing pad.

9. A method for forming a semiconductor device structure, comprising:
providing a first layer;
forming a second layer over the first layer, wherein the second layer is made of a semiconductor material;
performing a first planarization process to remove an upper portion of the second layer, wherein the first planarization process uses an abrasive material, and a portion of the abrasive material remains on the first layer and forms residues after the first planarization process;
removing the residues, wherein the removing of the residues comprises:
performing a first cleaning process using a first cleaning solution; and
performing a second cleaning process using a second cleaning solution, wherein the first cleaning solution is different from the second cleaning solution, the second cleaning solution comprises a first chelating agent, the second cleaning solution is an acid solution, and the first chelating agent comprises citric acid, oxalic ligand acid, ethylenediamine tetraacetic acid, or etidronic acid;
performing an etching process to partially remove an upper portion of the first layer; and
performing a second planarization process of the first layer.

10. The method for forming the semiconductor device structure as claimed in claim 9, wherein the first cleaning solution is an alkaline solution.

11. The method for forming the semiconductor device structure as claimed in claim 10, wherein the alkaline solution is a weak alkaline solution.

12. The method for forming the semiconductor device structure as claimed in claim 11, wherein the alkaline solution comprises $NH_4OH$.

13. The method for forming the semiconductor device structure as claimed in claim 9, wherein the second cleaning process uses a brush, the brush is soaked in a third cleaning solution before the second cleaning process, and the third cleaning solution comprises a second chelating agent.

14. The method for forming the semiconductor device structure as claimed in claim 13, wherein the second chelating agent comprises citric acid, oxalic ligand acid, ethylenediamine tetraacetic acid, or etidronic acid.

15. The method for forming the semiconductor device structure as claimed in claim 9, wherein the etching process further removes the second layer remaining over the first layer after the first planarization process.

16. A method for forming a semiconductor device structure, comprising:
forming a first layer over a substrate, wherein the substrate comprises a base portion and a fin portion over the base portion, the first layer covers the fin portion and the base portion, and the first layer wraps around the fin portion;
forming a second layer over the first layer;
performing a first planarization process to remove a portion of the second layer;
performing an etching process to partially remove an upper portion of the first layer;
performing a second planarization process of the first layer; and
after performing the second planarization process of the first layer, partially removing a first lower portion of the first layer.

17. The method for forming the semiconductor device structure as claimed in claim 16, further comprising:
forming a gate dielectric layer over the base portion and the fin portion before forming the first layer over the substrate, wherein the first layer is formed over the gate dielectric layer.

18. The method for forming the semiconductor device structure as claimed in claim 16, wherein a second lower portion of the first layer remaining after the partially removing of the first lower portion of the first layer has a strip shape in a top view of the first layer.

19. The method for forming the semiconductor device structure as claimed in claim 18, further comprising:
forming a spacer over a sidewall of the second lower portion of the first layer.

20. The method for forming the semiconductor device structure as claimed in claim 19, further comprising:

forming a dielectric layer over the substrate and surrounding the spacer and the second lower portion of the first layer.

\* \* \* \* \*